United States Patent [19]

Chaloux, Jr. et al.

[11] Patent Number: 4,601,913
[45] Date of Patent: Jul. 22, 1986

[54] UNDERLAY SURFACE MODIFICATION TO CONTROL RESIN GLASS POLYMERIZATION

[75] Inventors: Paul N. Chaloux, Jr., Wappingers Falls; Janos Havas, Hopewell Junction, both of N.Y.

[73] Assignee: International Business Machines Corporation, Armonk, N.Y.

[21] Appl. No.: 814,581

[22] Filed: Dec. 27, 1985

Related U.S. Application Data

[63] Continuation of Ser. No. 624,878, Jun. 27, 1984, abandoned.

[51] Int. Cl.$^4$ .............................................. B05D 3/06
[52] U.S. Cl. ........................................ 427/38; 427/40; 427/43.1
[58] Field of Search ........................... 427/38, 40, 43.1

[56] References Cited

U.S. PATENT DOCUMENTS

| | | | |
|---|---|---|---|
| 3,829,324 | 8/1974 | Blais et al. | 427/43.1 |
| 4,004,044 | 1/1977 | Franco et al. | 427/43.1 |
| 4,202,914 | 5/1980 | Havas et al. | 427/38 |
| 4,292,397 | 9/1981 | Takeuchi et al. | 427/40 X |
| 4,333,793 | 6/1982 | Lifshitz et al. | 427/40 X |
| 4,452,679 | 6/1984 | Dunn et al. | 427/38 X |
| 4,456,675 | 6/1984 | Anderson, Jr. et al. | 427/43.1 X |
| 4,460,436 | 7/1984 | Hiraoka | 427/43.1 X |
| 4,481,049 | 11/1984 | Reichmanis et al. | 427/43.1 X |

*Primary Examiner*—Thurman K. Page
*Attorney, Agent, or Firm*—Shirley Church Moore

[57] ABSTRACT

Three-dimensional polymerization of resin glass on an underlay surface may cause uneven distribution of the layer and therefore uneven etching of the glass layer in subsequent processing. The glass remaining after an etching step can cause difficulties in further processing of the structure, such as causing metal opens in a metallization step. In order to control the three-dimensional polymerization; the underlay surface is treated with a short plasma treatment. The plasma oxidizing step renders the surface acidic, forcing the glass polymerization to occur in a two-dimensional mode thereby eliminating the threat of uneven distribution and its repercussions.

8 Claims, 14 Drawing Figures

UNDERLAY SURFACE MODIFICATION TO CONTROL RESIN GLASS POLYMERIZATION

This applicaation is a continuation of Ser. No. 624,878, filed June 27, 1984 and now abandoned.

BACKGROUND OF THE INVENTION

In the process of forming a glass lift-off mask on an underlay surface, the glass resin is often deposited over a photoresist made up of a solvent soluble polymer, specifically an organic layer. As the resin glass is spun onto the underlay surface, it has a tendency to polymerize. The polymerization occurs in a three-dimensional mode resulting in a unevenly distributed resin glass layer. If subsequent processing requires a step of etching the glass mask, the glass inclusions caused by the three-dimenisonal polymerization may not etch thoroughly and the glass which remains may present obstacles to subsequent processing, particularly if there is a need for a subsequently deposited layer to be planar and/or continuous. In the past, in order to eliminate the polymerization of glass resin, various extensive filtration techniques, such as filtering the glass through celite beds, have been utilized in efforts to "purify" the resin glass. Such attempts to prevent or modify the polymerization by treating the glass have proved unsuccessful; because, as herein disclosed, it has been determined that most of the polymerization takes place on the underlay surface itself, therefore requiring surface modification. Surface modification, in general, is not a new concept. Well-known teachings show surface modification to attain various ends, including increased adherence, better conductivity, improved dyeability and other ends (See: U.S. Pat. No. 3,829,324 and discussions therein).

It is therefore an objective of the present invention to provide a method for modifying an underlay surface in order to control the polymerization of subsequently deposited resin glass.

It is another objective of the invention to teach a method for providing an evenly distributed glass overlay surface.

It is a further objective of the invention to provide a means for avoiding metal opens in glass liftoff/metallization processing.

SUMMARY OF THE INVENTION

These and other objectives are attained by the subject method which teaches modification of the underlay surface onto which a resin glass layer is to be deposited. By modification of the underlying surface, to render it acidic rather than basic, the mode of the polymerization which takes place in the deposited glass is altered from a three-dimensional to a two-dimensional mode insuring even distribution of the resin glass layer.

DETAILED DESCRIPTION OF THE PREFERRED EMBODIMENT

Figure 1:
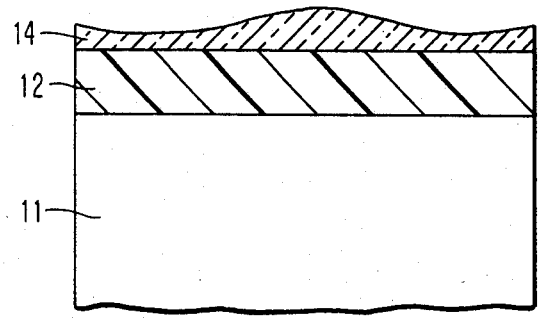
FIG. 1 is a cross-sectional view of an unevenly distributed resin glass layer formed on an anderlay surface in accordance with well-known techniques.
Figure 2:
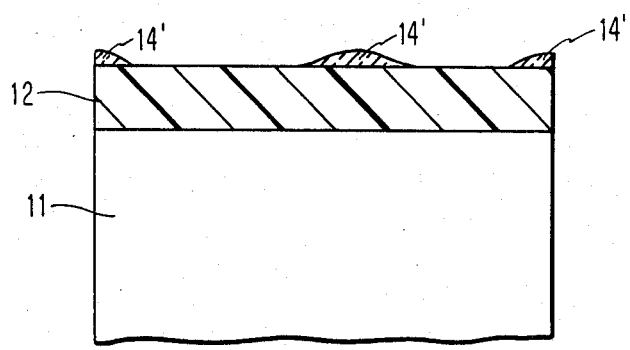
FIG. 2 illustrates the problem of residual glass deposits left after a glass etching step.

The difficulty addressed by the present invention is illustrated in FIGS. 1 and 2. When a resin glass layer, 14, is deposited onto an underlay surface, 13, it has a tendency to polymerize. If the underlay surface, 12, is made up of a compound which is a base, then the resin glass will polymerize in a three-dimensional mode, and as illustrated by layer 14 in FIG. 1, will result in localized thickness variations. Should a subsequent glass etching step be required using, for example, a reactive ion etch to uniformly remove the glass, the greater thicknesses of glass may not etch thoroughly. The resulting glass islands which remain, as illustrated in FIG. 2 at 14', can seriously affect subsequent processing and potentially destroy the utility of the resulting structure. Examples of the problems that the non-etched glass may present include the interruption of a subsequently deposited layer where continuity or planarity of the layer is essential or resistance of the glass to an etching step intended to selectively remove the underlying layer, 12, whereby the glass inclusion "protects" that layer from the desired etching.

More specifically, the effect of the subject polymerization on the formation of metal patterned films utilizing transparent liftoff masks, as disclosed in U.S. Pat. Nos. 4,004,044 and 4,202,914, is illustrated in FIGS. 3A-E and FIGS. 4A-E. FIGS. 3A-3D show the steps utilized in the above-cited patents to achieve the metal patterned film disclosed therein and illustrated in FIG. 3E. The steps involved are: (A) depositing a photoresist layer 15, on a substrate, 20 and overlying said photoresist with a glass liftoff mask layer, 16; (B) etching said liftoff mask, 16 by the use of an additional photoresist layer 17; (c) removing the photoresist layers 17 and 15 in all exposed areas, leaving the exposed substrate in the non-mask areas; (D) depositing metal layer 18; (E) removing the remaining photoresist 15 and thereby removing the overlying metal and glass layers 18 and 16. The result is a metal channel, as illustrated in perspective at 3E, on the substrate surface. FIGS. 3A-E illustrate the ideal process and product embodiment as taught in U.S. Pat. Nos. 4,004,044 and 4,202,914. However, the glass polymerization problem discussed above can severely affect that process as illustrated in FIGS. 4A-4E.

Figure 3A:
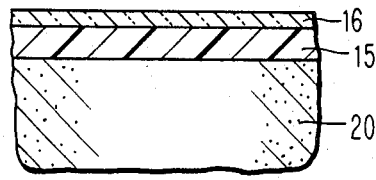
FIGS. 3A-3D are cross-sectional views of the ideal metallization/lift off technique known in the art.
Figure 4A:
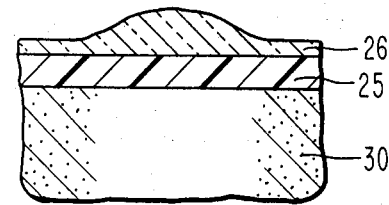
FIGS. 4A-4D are cross-sectional views of the actual metallization/liftoff processes known in the art.
Figure 3B:
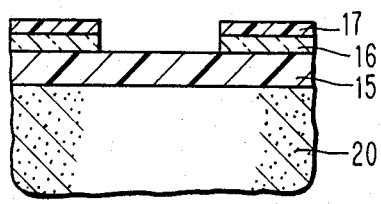
Figure 4B:
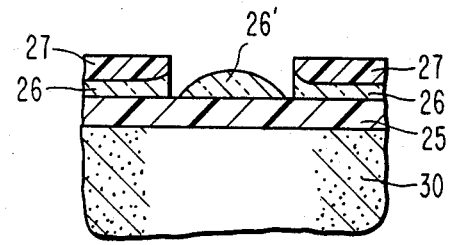
Figure 3C:
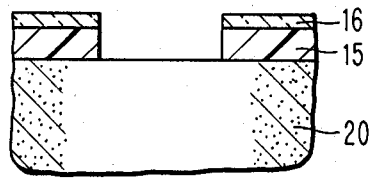
Figure 4C:
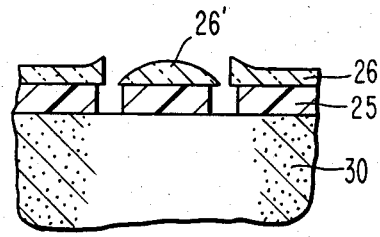
Figure 3D:
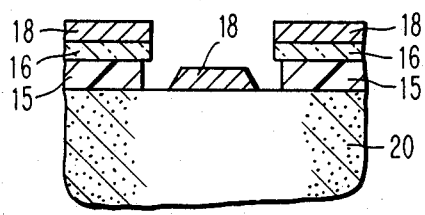
Figure 4D:
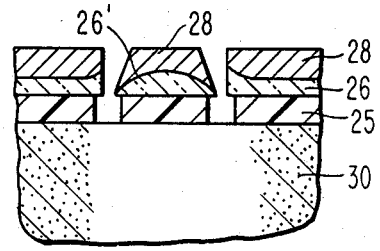
Figure 3E:
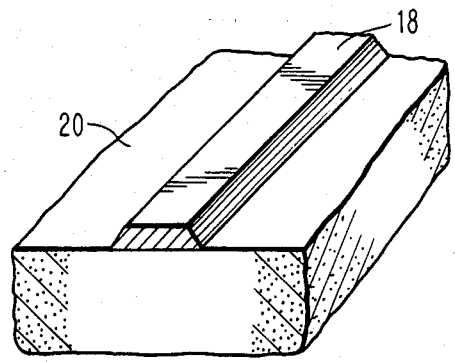
FIG. 3E is a perspective view of same.
Figure 4E:
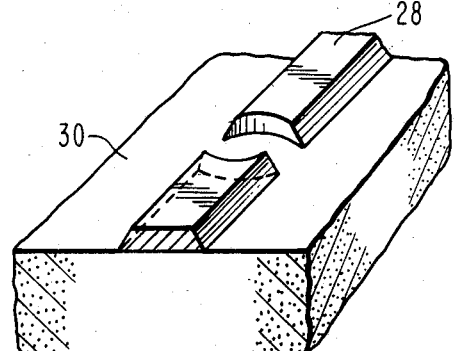
FIG. 4E is a perspective view of the same.

A glass resin layer deposited on a photoresist layer will undergo polymerization in a three-dimensional mode; and, it will not occur as the perfectly planar surface that is seen at 16 on FIG. 3A. Rather, the glass layer will have localized thickness variations as FIG. 4A illustrates at 26. It is possible that the glass thickness variations would not affect the further processing; however, if the glass inclusions are located in the path of the subsequent etching and metallization steps, they prove fatal to the patterned film. As illustrated in FIG. 4B, a Uniform etching step, tor example, a reactive ion etch of the resin glass, will not remove all of the glass from the photoresist layer in the critical area. The glass island, 26', which remains acts as a shield for the underlying photoresist, 25, in the etching step of 4C. The metal layer, 28, deposited in the step illustrated at 4D is deposited over the glass island 26′ rather than directly on substrate 30. Consequently, the metal is lifted off with the glass in the following process step when the remaining photoresist, 25, is removed; thereby leaving the substrate bare. Void, 29, in perspective view 4E illustrates the point at which the metallization has been interrupted by an open resulting from the glass inclusion.

Efforts to address this problem in the past, as noted above, concentrated on the resin glass, usually between 60% and 80% silicon dioxide, $SiO_2$, and 40% to 20% carbon, hydrogen and silicon molecules, using filtration techniques to "purify" and regulate the resin glass to be deposited. The proposed solution herein involves a modification of the underlay surface itself. As herein disclosed, it has been determined that polymerization of glass resin occurs at the underlay surface and that the mode of the polymerization can be affected and effected by modification of the nature of the surface itself. If the underlay surface is made up of a material which is basic, the resin glass undergoes a three-dimensional polymerization. If, however, an acidic surface is induced, the polymerization of the resin glass layer is in a two-dimensional, linear mode.

Figure 5:
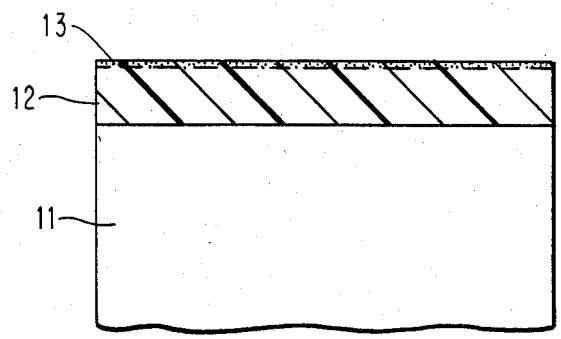
FIG. 5 is a cross-sectional view illustrating the inventive modification to the underlay surface.
Figure 6:
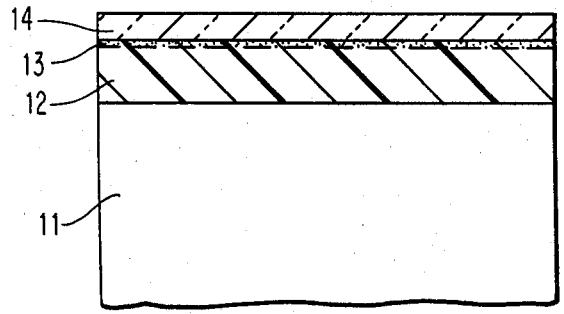
FIG. 6 is a cross-sectional view of an evenly distributed resin glass layer deposited after applying the subject inventive method.

In the preferred embodiment herein, as illustrated in FIG. 5, the underlay surface, 12, is a photoresist layer, for example, a novolak/diazoquinone positive resist. The photoresist layer, 12, is comprised of an organic compound which is basic and which, upon direct resin glass deposition, by well-known spin on techniques, will induce a three-dimensional glass polymerization yielding the structure of FIG. 1. The inventive solution comprises modifying the photoresist underlay surface, 12, to render it acidic. This can be done by various alternative techniques, which would be obvious to one having ordinary skill in the art. However, in addition to rendering the surface acidic, the invention requires that there be no degradation of, nor change in the properties of the photoresist underlay. Therefore, in the preferred embodiment, the photoresist surface is exposed to a short plasma treatment in order to oxidize it and thereby render it acidic. Since only the surface of the photoresist comes into contact with the subsequently deposited resin glass, it is only the surface or the first monolayer of the photoresist that need be oxidized. Plasma treatment is a method, well-known and fully described in the literature, which is generally used for removing a photoresist layer (see U.S. Pat. No. 4,202,914, Col. 4 lines 38 et seq). The plasma treatment step performed, therefore, must be of very short duration, for example 15–20 seconds, in order to induce the acidic surface *without* removing the photoresist. Furthermore, the plasma treatment is chosen for the ability of the excited oxygen atoms to quickly attack the top monolayer of the surface of the organic resist layer, form hydroxyl or carboxyl groups, and have no deleterious effect on the properties of the photoresist layer. As illustrated in FIG. 5, the short plasma treatment step provides the photoresist layer, 12, with an acidic surface monolayer, 13. When a resin glass layer is subsequently deposited over the acidic top surface monolayer, as illustrated in FIG. 4, the resin glass, 14, polymerizes linerly forming an evenly distributed layer free from the thickness variations attendant to the three-dimensional polymerization of the past.

While the subject invention has been particularly described with reference to a preferred embodiment, it is understood that modifications may be effected by one having ordinary skill in the art without departing from the spirit and scope of the teachings and of the appended claims.

What is claimed is:

1. A process for modifying a polymeric material surface to facilitate formation of an organosilicon-containing masking material thereon, said process comprising:
   treating said polymeric material surface in an oxidizing plasma to form acidic functional groups upon said surface; and
   subsequently forming a layer of an organosilicon-containing material on said treated surface.

2. The process of claim 1 wherein said organosilicon-containing polymerizable material comprises a resin glass.

3. The process of claim 2 wherein said polymeric material comprises a novolak/diazoquinone positive resist.

4. The process of claim 3 wherein said oxidizing plasma comprises oxygen.

5. The process of claim 4 wherein said oxidizing plasma forms at least one functional group selected from the group consisting of hydroxyl and carboxyl upon said polymeric material surface.

6. The process of claim 1 wherein said polymeric material overlays a substrate and further comprising the steps of:
   patterning said layer of silicon-containing material to provide openings extending through said layer to said polymeric material surface;
   transferring said pattern from said silicon-containing material through said polymeric material, to extend said openings to said substrate underlaying said polymeric material;
   blanket depositing conductive metallurgy over the masking layers of organosilicon-containing material and underlaying polymeric material and in said openings; and
   removing said layer of polymeric material, thereby removing overlying portions of said organosilicon-containing material and said metallurgy.

7. The process of claim 2 wherein said resin glass is comprised of from about 60% to 80% silicon dioxide and from about 40% to about 20% of molecules comprising carbon, hydrogen and silicon.

8. The process of claim 6 wherein said remaining portions of said layer of polymeric material are removed by solvation using a suitable solvent.

* * * * *